(12) United States Patent
Bordes et al.

(10) Patent No.: US 11,646,723 B2
(45) Date of Patent: May 9, 2023

(54) PULSE STRETCHER

(71) Applicant: NXP USA, INC., Austin, TX (US)

(72) Inventors: Laurent Bordes, Aucamville (FR); Baptiste Bernardini, Le Plessis Trevise (FR); Julien Burro, Deyme (FR)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 17/813,338

(22) Filed: Jul. 19, 2022

(65) Prior Publication Data

US 2023/0031303 A1    Feb. 2, 2023

(30) Foreign Application Priority Data

Jul. 27, 2021 (EP) .................................. 21306038

(51) Int. Cl.
| H03K 5/04 | (2006.01) |
| H03K 5/06 | (2006.01) |
| H03K 19/20 | (2006.01) |
| H03K 5/00 | (2006.01) |

(52) U.S. Cl.
CPC .............. *H03K 5/06* (2013.01); *H03K 19/20* (2013.01); *H03K 2005/00078* (2013.01)

(58) Field of Classification Search
CPC . H03K 5/06; H03K 19/20; H03K 2005/00078
USPC ....................................................... 327/174
See application file for complete search history.

(56) References Cited

U.S. PATENT DOCUMENTS

| 4,425,514 | A | * | 1/1984 | Orr | ......................... | H03K 5/06 |
| | | | | | | 327/176 |
| 5,724,562 | A | * | 3/1998 | Ishiwaki | ............... | G06F 9/3869 |
| | | | | | | 713/400 |
| 7,795,927 | B2 | * | 9/2010 | Farwell | .............. | H03K 19/0033 |
| | | | | | | 327/263 |
| 11,177,805 | B1 | * | 11/2021 | Pant | ..................... | H03K 19/003 |
| 2008/0238509 | A1 | * | 10/2008 | Fairbanks | ............ | H03K 5/1565 |
| | | | | | | 327/175 |
| 2015/0349754 | A1 | * | 12/2015 | Ishii | ....................... | H03K 3/017 |
| | | | | | | 327/174 |

FOREIGN PATENT DOCUMENTS

JP    S6076807 A    5/1985

* cited by examiner

*Primary Examiner* — Ryan Jager

(57) ABSTRACT

A pulse stretcher is disclosed comprising, a stretcher input (10) and a stretcher output (20); an asynchronous finite state machine; and a delay generator (40) having a delay input connected to the stretcher output, and a delay output connected to a second input of the FSM. The asynchronous FSM comprises: a first Muller C-element gate (250) having an output connected to the stretcher output, a second Muller C-element gate (260) having an output; and a combinatorial logic circuit (270) connected to the stretcher input, to first and second inputs of each of the first and second C-elements. The first and second Muller C-element gates are cross-coupled via the combinatorial logic, such that the respective outputs of the C-element gates are complementary and, in response to receiving the input pulse at the stretcher input, the output of the first Muller C-element gate provides a stretched version of the input pulse.

20 Claims, 8 Drawing Sheets

- $Y\_S0 = S1.OUT\_del + S0.\overline{IN} + S0.\overline{S1} + \overline{S1}$
- $IN1\_S0 = S1.OUT\_del + \overline{S1} = \overline{S1.OUT\_del}$
- $IN2\_S0 = \overline{IN} + \overline{S1} = \overline{IN.S1}$
- $Y\_S1 = S0.IN + S1.OUT\_del + S0$
- $IN1\_S1 = S0.IN$
- $IN2\_S1 = OUT\_del + S0 = \overline{OUT\_del.S0}$

PULSE STRETCHER

CROSS-REFERENCE TO RELATED APPLICATIONS

This application claims the priority under 35 U.S.C. § 119 of European Patent application no. 21306038.7, filed on Jul. 27, 2021, the contents of which are incorporated by reference herein.

FIELD

The invention relates to pulse stretching, and in particular to pulse structures configured to provide a stretched, or relative long, version of a relatively short input pulse.

BACKGROUND

Pulse stretchers are of interest in a variety of applications. They are of particular interest in low power applications and very low power applications in which circuits may be partially powered down between operations in order to conserve power. Such circuits are often configured to periodically poll for an incoming wake-up signal which instructs, or requires, the circuit to wake up. In order to ensure proper operation of such circuits, any such incoming signal must have sufficiently long duration to ensure that it overlaps with at least one of the periodic polls. Conversely, when the circuit is operating it may be required to communicate, and in particular to receive, information over the same channel as the wake-up signal at a rate which is too high to be compatible with such a long duration wake-up signal. In one nonlimiting example automobile application which will be discussed in more detail hereinbelow, communication may be required at several megahertz, such that a normal pulse of an incoming wake-up signal length would be a few tens of nanoseconds; conversely in order to conserve power, the circuitry may only poll for the wake-up signal once every few microseconds. In such circumstances a pulse stretcher may be required to convert an incoming pulse of a few nanoseconds to a stretched signal lasting microseconds.

Although pulse structures are known, current designs typically suffer from metastability or violate conventional timing requirements.

BRIEF DESCRIPTION OF DRAWINGS

Embodiments will be described, by way of example only, with reference to the drawings, in which.

Figures 1, 9:
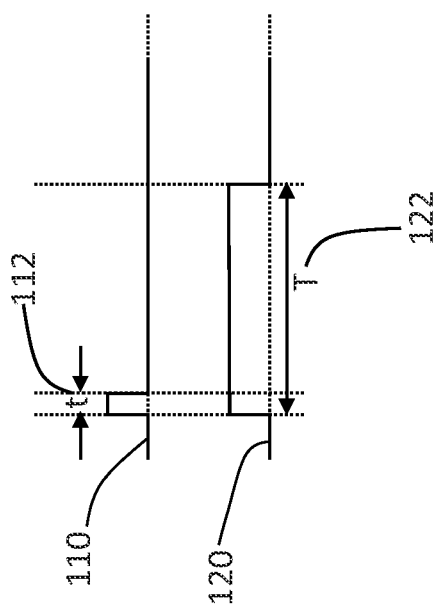
FIG. 1 illustrates an example of a stretched pulse.
FIG. 9 details the logical equations defining the finite state machine.

It should be noted that the Figures are diagrammatic and not drawn to scale.

Relative dimensions and proportions of parts of these Figures have been shown exaggerated or reduced in size, for the sake of clarity and convenience in the drawings. The same reference signs are generally used to refer to corresponding or similar features in modified and different embodiments

DETAILED DESCRIPTION OF EMBODIMENTS

FIG. 1 illustrates an example of a stretched pulse. The figure shows, at 110 a relatively short incoming pulse, of duration t 112. As shown, the pulse may be a positive-going pulse on a normally low signal line, and this is required for some applications, such as a for wake-up communications; in other applications the pulse may, alternatively, be negative-going on a normally high signal line. The figure also shows, at 120, a stretched version of the incoming short pulse. The stretched version has a duration T 122. As shown the stretched version may have the same polarity as the incoming short pulse that is to say in this case it is a positive going pulse on a normally low signal line. Although not limited thereto, the duration t of the shortcoming pulse may be a few nanoseconds or a few tens of nanoseconds, for instance it may be in a range of 4 to 40 ns; conversely the duration of the stretched pulse may be several microseconds in duration.

Figure 2:
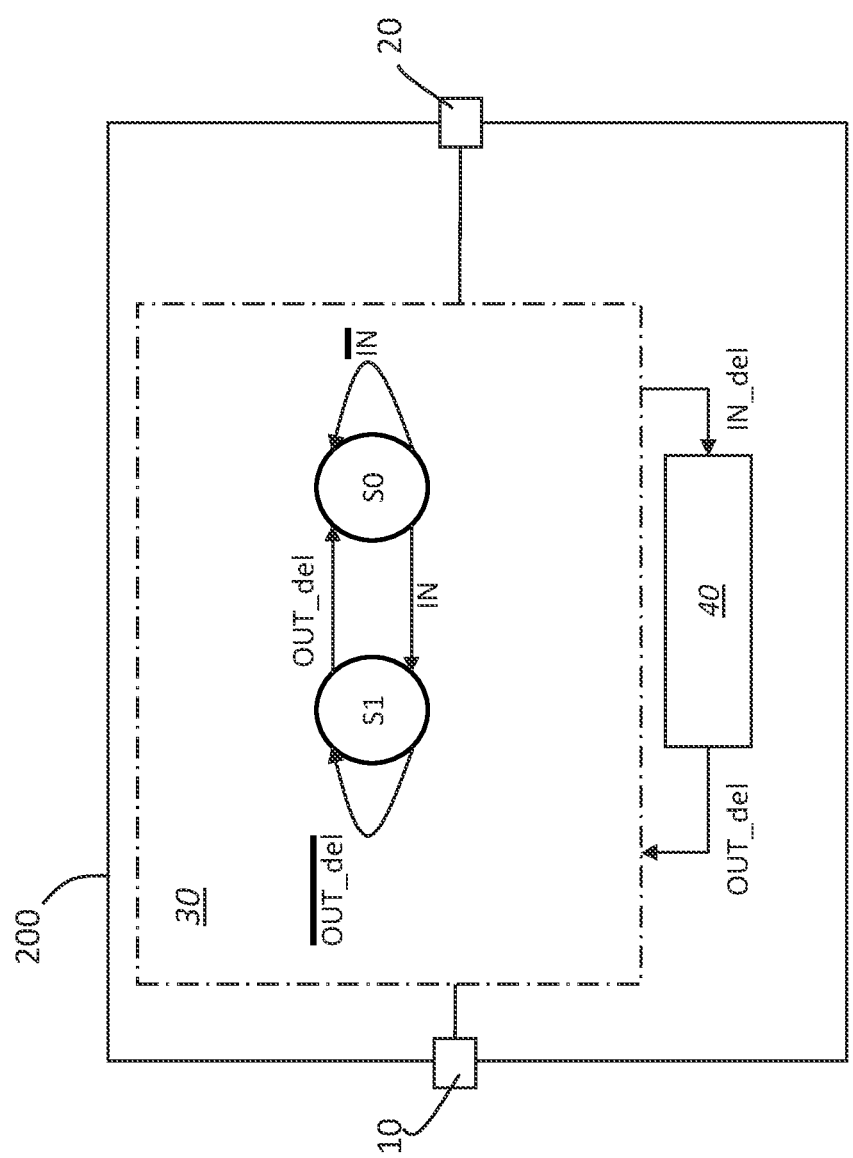
FIG. 2 illustrates the general concept of a pulse stretcher according to one or more embodiments.

FIG. 2 illustrates the general concept of a pulse stretcher 200 according to the present disclosure. The pulse stretcher 200 comprises a stretcher input 10 and a stretcher output 20. The stretcher input is configured to receive an input pulse, which typically may have a duration of a few nanoseconds up to a few tens of nanoseconds or a few hundreds of nanoseconds. The pulse stretcher is configured to, in response to receiving the input pulse, provide an output pulse which is a stretched version of the input pulse, and typically may have a duration of a few hundreds of nanoseconds up to a few microseconds or a few tens of microseconds.

The pulse stretcher comprises an asynchronous finite state machine, FSM, 30 and a delay generator 40. The FSM has a first FSM input connected to the input, and an FSM output connected to the stretcher output.

The asynchronous FSM has two inputs, "IN" and "OUT_del" and two states, S0 and S1, and is configured to transition between the two states in response to appropriate configurations of its inputs. In particular, the asynchronous FSM transitions from state S0 to state S1 in response to the input "IN" transitioning from low to high; conversely, a transition from high to low of this input (that is to say, "$\overline{IN}$"), does not result in a state change from S0 to S1. Similarly, the asynchronous FSM transitions from state S1 to S0 in response to receiving a input "OUT_del" transitioning from two high; conversely, a transition from high to low of this input (that is to say,"$\overline{OUT\_del}$"), does not result in a state change from S1 to S0.

As ready mentioned, the FSM is an asynchronous FSM. In this context, "asynchronous" means that the changes of state are not limited by, or constrained by, clock edges. In contrast, for logic synchronized with the clock the gates have to respect specific timings such as reset timing, hold timing (otherwise, problematic issues such asa flip flop metastability may occur).

Furthermore, with asynchronous logic, there is no forbidden state compared to a RS latch circuitry. The state 11 in an RS latch (reset=1 and set=1) results in an undefined output state. It is impossible to know if the output state is 1 or 0.

The two inputs to the finite state machine are "IN" and "OUT_del". "IN" corresponds to the input on the stretcher input, such that the input pulse corresponds to a transition from low to high ($\overline{IN}$ to IN), at the start of the input pulse, followed by the opposite transition (IN to $\overline{IN}$) at the end of the input pulse. "OUT_del" is the output from the delay generator 40.

The delay generator has a delay input, IN_del, connected to the stretcher output, and a delay output OUT_del connected to a second input of the FSM. The delay generator is configured to transition its output OUT_del from low-to-high, in response to receiving a low-to-high transition at its input IN_del, at the end of a predetermined interval or delay period immediately after the input transitions. Whereas the IN input may return to a low state, the finite state machine ensure that the IN_del input remains high (as will be discussed in more detail below). After the output transitions to "high" the delay generator is configured to reset prior to any subsequent low-to-high transition at its input. The skilled person will be familiar with a variety of implementations of delay generators. For example, and without limitation, the delay generator may be based on a capacitor charging circuit, for instance using a current source as shown in more detail in FIG. 7 or a resistor as shown in more detail in FIG. 8, which charges a capacitor during the delay interval, and a comparator which checks the capacitor voltage and transitions the output in response to the capacitor reaching a predetermined voltage. In such an implementation, resetting the delay generator corresponds to discharging the capacitor in preparation for a subsequent charging.

The asynchronous FSM can be described through the following set of equations (also copied as FIG. 9), which define the logical values for the state of S0 (that is to say, Y_S0), IN1_S0, and IN2_S0, and similarly, for the states of S1 (that is to say, Y_S1), IN1_S1, and IN2_S:

$$\text{i.} Y\_S0 = S1.\overline{OUT\_del} + S0.\overline{IN} + S0.\overline{S1} + \overline{S1} \quad (1)$$

$$\text{ii.} IN1\_S0 = S1.OUT\_del + \overline{S1} = \overline{S1.\overline{OUT\_del}} \quad (2)$$

$$\text{iii.} IN2\_S0 = \overline{IN} + \overline{S1} = \overline{IN.S1} \quad (3)$$

$$\text{iv.} Y\_S1 = S1.IN + S0.\overline{OUT\_del} + \overline{S0} \quad (4)$$

$$\text{v.} IN1\_S1 = S0.IN \quad (5)$$

$$\text{vi.} IN2\_S1 = \overline{OUT\_del} + \overline{S0} = \overline{INT\_del.S0} \quad (6)$$

Figure 3:
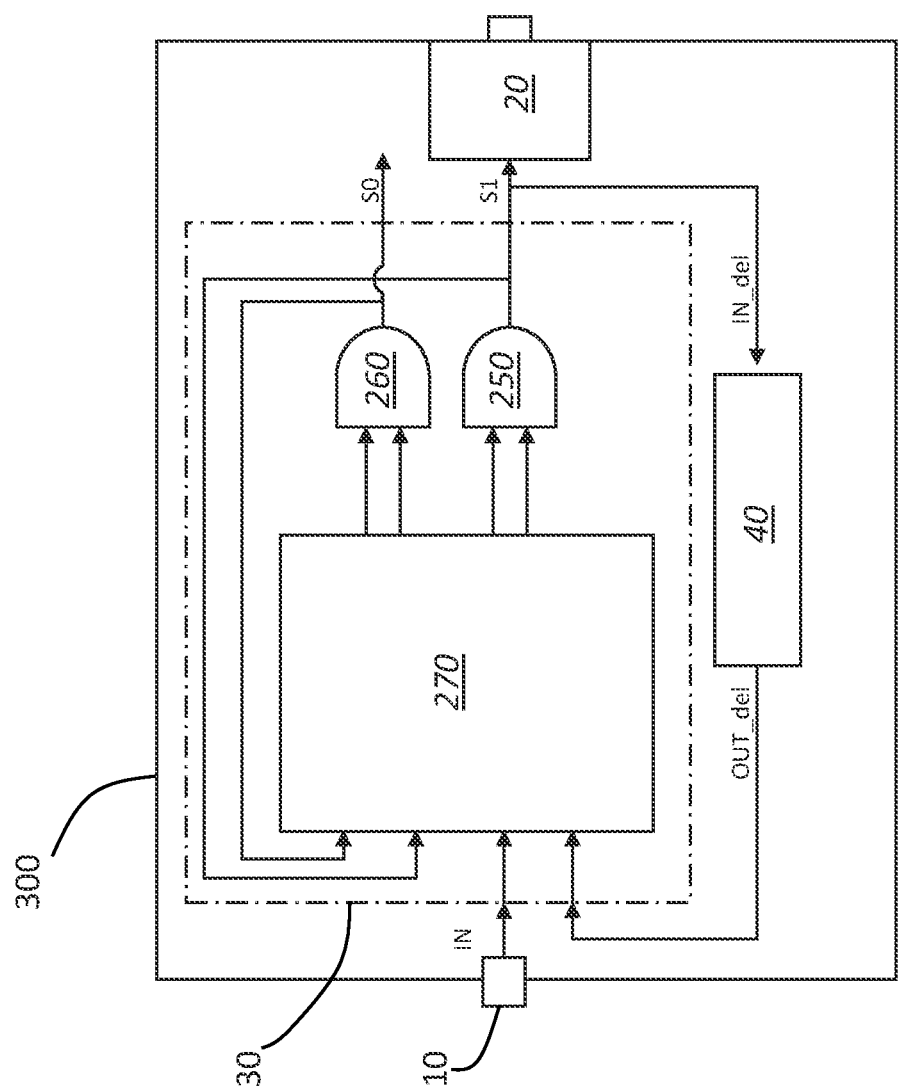
FIG. 3 shows, schematically, a pulse stretcher according to one or more embodiments.

FIG. 3 shows, schematically, a pulse stretcher according to one or more embodiments and configured to implement the above logic. The pulse structure 300 comprises a stretcher input 10 and a stretcher output 20, an asynchronous finite state machine, FSM, 30 and a delay generator 40. The asynchronous FSM 30 comprises a pair of Muller C-element gates, 250 and 260 and combinatorial logic 270. The first Muller C-element gate 250 has an output connected to the stretcher output 20, and two ("first" and "second") first-gate inputs connected to the combinatorial logic circuit; the second Muller C-element gate 260 has an output which is connected to the combinatorial logic providing a feed-back circuit, and two ("first" and "second" second-gate inputs connected to the combinatorial logic circuit.

The combinatorial logic circuit 270 is connected to the stretcher input, to the output OUT_del of the delay generator, to first and second first-gate inputs of the first C-element, and to first and second second-gate inputs of the second C-element; the combinatorial logic is configured to cross-couple the first and second Muller C-element gates, as further described below, and to implement the asynchronous FSM.

Figure 4:
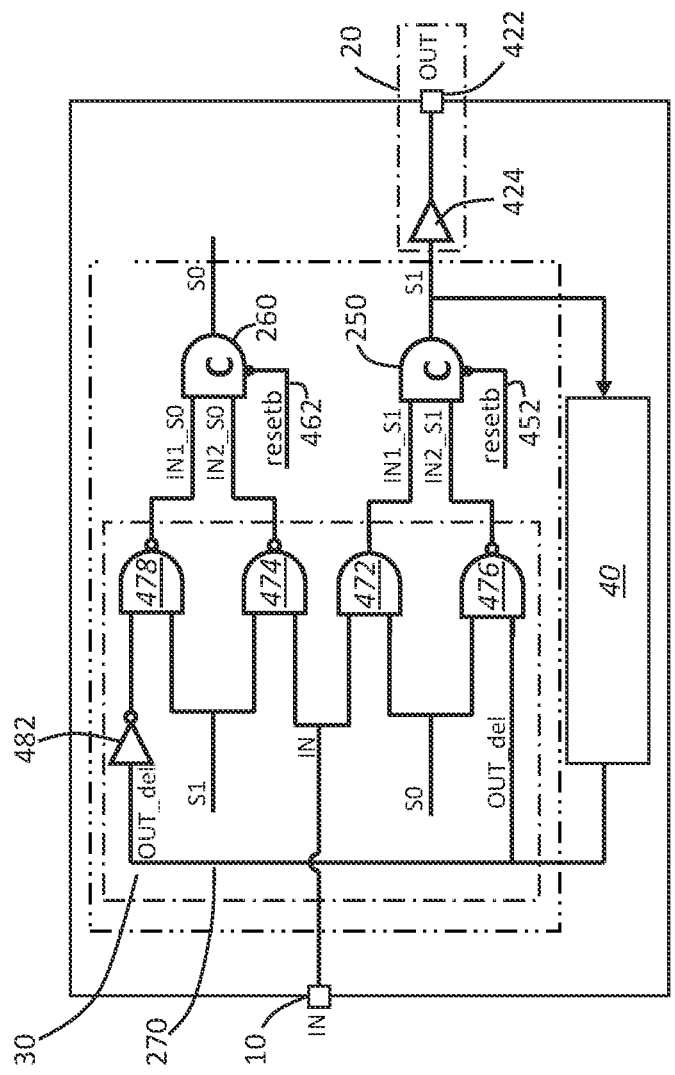
FIG. 4 shows the pulse stretcher of FIG. 3 in more detail.

FIG. 4 shows the pulse stretcher of FIG. 3 in more detail, according to one or more embodiments in which the combinatorial logic 270 is implemented as a set of NAND and AND gates. The skilled person will appreciate, however, that the combinatorial logic 270 may be implemented by alternative sets of gates, which comprise only NAND gates, or which may comprise NOR gates or a combination of NOR and OR gate, or other combinations of the various types of logic gates. The skilled person will equally appreciate that the specific implementation or embodiment chosen may be influenced by factors including the area of silicon required to layout circuit, the operating voltages or conditions, etc.

Returning to the specific NAND and AND implementation shown in FIG. 4. combinatorial logic comprises an AND gate 472 and first 474, second 476 and third 388 NAND gates. The AND gate 472 and the first NAND gate 474 each has a first input connected to the stretcher input IN, a respective second input connected to the output of the second 260 and first 250 Muller C-element gate respectively, and a respective output connected to a first input of the first and second Muller C-element gate respectively. That is to say, the second input of the AND gate 472 is connected to the output S0 of the second Muller C-element gate, the second input of the first NAND gate 474 is connected to the output S1 of the first Muller C-element gate, the output of the AND gate 472 is connected to a first input IN1_S1 of the first Muller C-element gate, the second input of the first NAND gate 474 is connected to a first input IN1_S2 of the second Muller C-element gate.

Further, the second 476 and third 478 NAND gates each has a respective first input connected to the output of the delay generator and an inverted version of the output of the delay generator respectively, a respective second input connected to the output of the second and first Muller C-element gate respectively, and a respective output connected to a second input of the first and second Muller C-element gate respectively.

That is to say, the second input of the second NAND gate 476 is connected to the output S0 of the second Muller C-element gate, the second input of the third NAND gate 478 is connected to the output S1 of the first Muller C-element gate, the output of the second NAND gate 476 is connected to a second input IN2_S1 of the first Muller C-element gate, the second input of the first NAND gate 478 is connected to a second input IN1_S2 of the second Muller C-element gate. The combinatorial logic comprises an inverter 482, in the path between the delay generation output and the third NAND gate and configured to provide the inverted version of the output of the delay generator.

Finally, as can be seen in FIG. 4, the first and second Muller C-element gate each has a respective connection 452, 462 configured to reset the gate. These respective inputs allow the circuitry to set to a stable and known good state at startup. In the initial phase for an IC power up, all the logic gates should reset to 0 to be in a known state. So, the circuitry is built such as the FSM starts in the S0 state(=1) when reset is finished. The state S0 corresponds to a WAIT state of the input signal.

Figure 5:
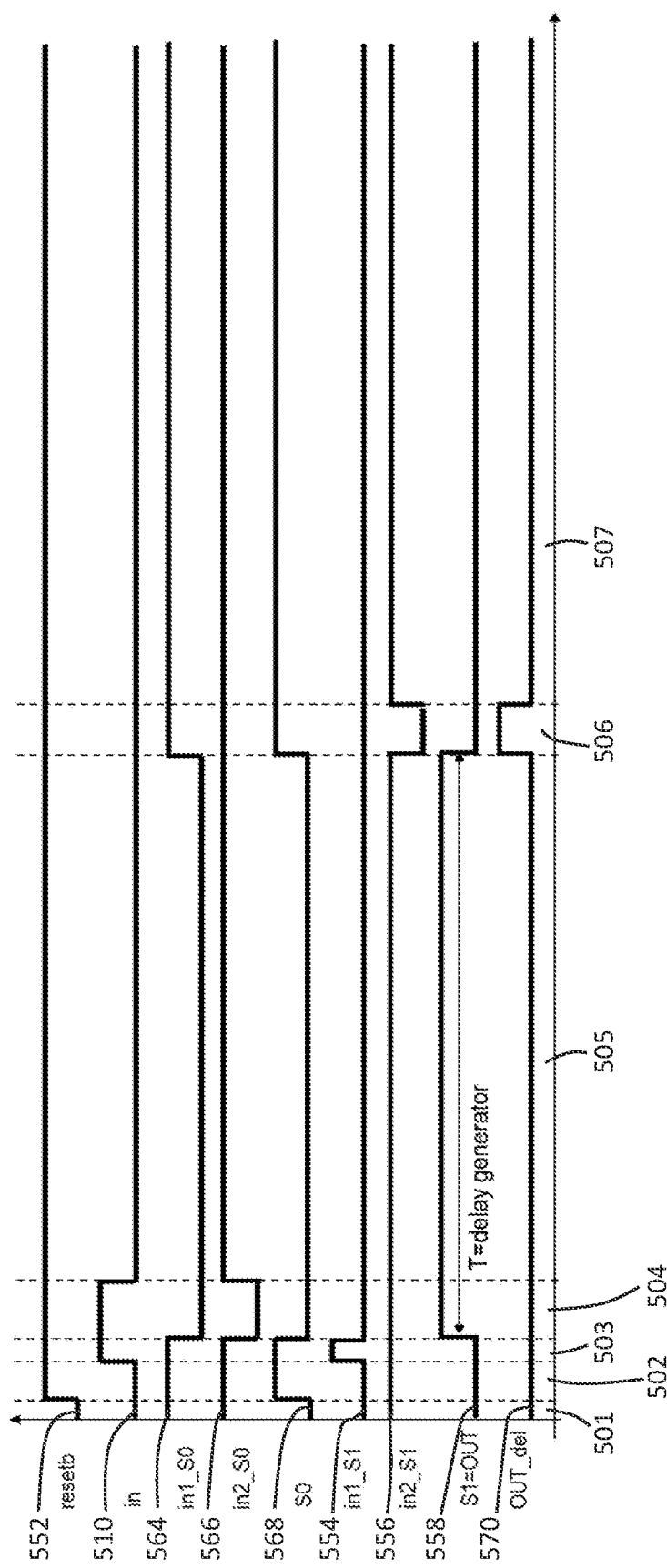
FIG. 5 shows a timing diagram of various signals associated with the pulse stretcher of FIG. 4.

The operation of the pulse stretcher shown in FIG. 4 may be explained with reference to FIG. 5, which shows a timing diagram of the various signals. It will be appreciated that although, as shown, the high value are associated with "set"

or "on" and low value of the signal is associated with "reset" or "off", the present disclosure is not limited thereto, and the inverse convention (that is to say high equals off, and low equals on) may be applied in other embodiments. FIG. 5 shows the status of each of the following signals which may be identified in the circuit of FIG. 4, starting with the signal resetb 552, at the top of the diagram, followed by the stretcher input "IN" at 510, the first input IN1_S0 564 to the second C-element gate, the second input IN2_S0 566 to the second C-element gate, and the output S0 568 from the second C-element gate. Below these are shown the first input IN1_S1 554 to the first C-element gate, the second input IN2_S0 556 to the first C-element gate, and the output S1 558 from the second C-element gate. As mentioned above, this output S1 is the output "OUT" from the pulse stretcher, and also is the input IN_del to the delay generator. The lowermost signal is the output OUT_del 570 from the delay generator. It will be noted that, in comparison with FIG. 1, FIG. 5 depicts a delay between the start of the "IN" pulse 510 and the output S1 558, whereas no such delay is visible between the input pulse 110 and the stretched pulse 120 in FIG. 1. This is because the timing scale is not the same comparing the two figures. The delay between 510 and 558 corresponds to a digital propagation timing of digital gates, and is typically on the scale of picoseconds, ps, to nanoseconds, ns, rather than a scale of nanoseconds to microseconds μs or even milliseconds, ms, which is a typical scale of FIG. 1.

The various time-slots 501, 502 . . . 507 in the operation of the pulse stretcher are shown at the bottom of the diagram. Throughout time-slot 501, the circuitry is reset, so S0 and S1 are at logic value '0'. OUT_del delay signal is thus kept low. It should be noted that the OUT_del signal is an analog signal, in that the signal is built in an analog way, for instance using an RC analog circuitry or a I/C circuitry; it effectively becomes digital when the analog ramp crosses the threshold of the next gate (thereby creating a hysteresis buffer). Within the combinatorial logic circuit, IN1_S0 and IN2_S0 are at logic value '1'. IN1_S1 is at logic value '0' while IN2_S1 are at logic value '1'. Note, that according to this embodiment the reset is asserted by holding "resetb" 552 low and reset is released by allowing resetb 552 to go high: in other embodiments reset may be asserted by holding resetb 552 high.

At the start of time-slot 502, resetb 552 is no longer asserted, so S0 goes at logic value '1' since both the 2 inputs 564 and 566 of the C-element gate are at logic value '1'. The circuitry stays in this state until an event occurs on the IN input 510. This occurs at the start of time-slot 503, at which moment "IN" goes high. In the time-slot 503, the IN signal event results in a change to the state of IN1_S1 node. The duration of time-slot 503 corresponds to the propagation delay through the NAND gates and the C-element gate, such that at the end of this time-slot (corresponding to the start of time-slot 504), the previous change of IN1_S1 from '0' to '1' results in a change of S1 state (to high), and IN1_S0 and IN2_S0 from logic value '1' to '0' and so S0 state is back to '0' logic value. The change of state S0 gives IN1_S1 back to logic value '0'. The change of the state S1 from '0' to '1' is rising edge which defines the start of the delay generator.

Time-slot 4 lasts until the stretcher input IN 510 goes low at the end of the input pulse: the propagation time (time-slot 503), together with time-slot 504, thus corresponds to the duration of the input pulse. Input pulse IN 510 going low at the end of time-slot 504 forces IN2_S0 to go back to logic value '1'. This status remains throughout time-slot 505, until the end of this time-slot, which also marks the start of time-slot 506, at which moment the delay made with the generator is completed, sending the OUT_del signal high, and leading to a change in both IN1_S1 and IN2_S1. These 2 transition changes impact the state of S0 and S1, which go low, and high respectively.

The commencement of the stretched pulse is thus offset from the start of the input pulse, by a duration of the propagation delay 503; its duration, that is to say the length of time that S1 is high, is defined by the delay T of the delay generator.

Finally, time-slot 506, corresponds to a reset interval for the delay generator: In embodiments in which a capacitor charging is used to define the delay, the duration of this time-slot 506 corresponds to the time needed to discharge of the capacitor used in the delay generator. At the end of which duration OUT_del returns to low, which forces in2_S1 back high. The state machine is then in the same status as time-slot 502; that is to say it is ready and waiting to receive another input pulse IN 510.

Figure 6:
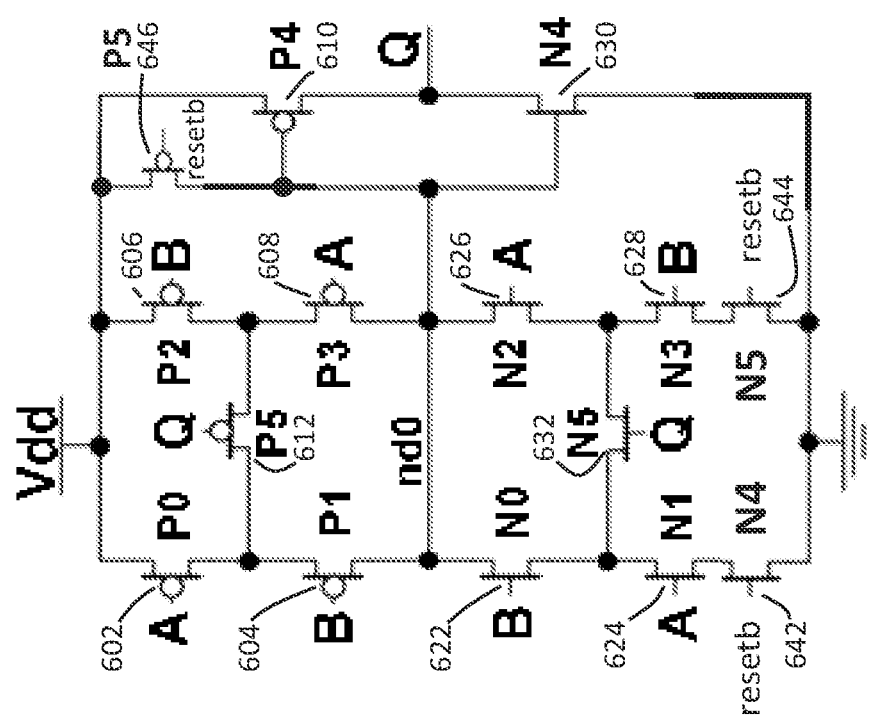
FIG. 6 shows a transistor-level circuit diagram of a Muller C-element gate as used in one or more embodiments.

FIG. 6 shows a transistor-level circuit diagram of a Muller C-element gate as used in one or more embodiments. The C-element gate is based on a Van Merkel design, but modified to add a "reset", or "clear" function. The skilled person will appreciate that other designs are available for C-element gates; the present disclosure is not limited to the specific a nonlimiting example discussed hereinbelow.

As shown, the C-element gate comprises a first set of four P-type FETs: P0 602, P1 604, P2 606 and P3 608. These are arranged with their main terminals in a full bridge configuration between a supply line Vdd and an intermediate line nd0, and having a fifth P-type FET 612 connected across the bridge-node. The C-element gate further comprises a corresponding second set of four N-type FETs: N0 622, N1 624 N2 626 and N3 628. These are arranged with their main terminals in a full bridge configuration between the intermediate line nd0, and a ground, and having a fifth N-type FET 632 connected across the bridge-node. However, this second bridge is modified relative to the conventional Van Merkel design, in that the lower legs N1 624 and N3 628 are not directly connected to the ground line, but have additional reset N-type FETs N4 642 and N5 644, connected in series between lower leg of FET N1 624 and N3 628 respectively and the ground line. Their gates are connected to reset input resetb=enable.

Within each bridge, the gates of the FETs on diagonally opposite sides are connected together at respective input nodes A and B, the connection to the input modes being symmetrical about the intermediate line nd0. That is to say, the gates of P-type FETs P0 602 and P3 608, along with the gates of N-type FETs N1 624 and N2 626, are each connected to input A, whilst the gates of P-type sets P1 604 and P2 606, along with the gates of N-type FETs N0 622 and N3 628, are each connected to input B.

A further N-type FET N4 630 is connected in series with a further P-type FET P4 610 between the ground and supply line Vdd, with a node therebetween which is connected to an output Q. Their gates are coupled together and to the intermediate line nd0. In another modification from the conventional Van Berkel design, a further p-type FET P5 646 is connected with its main terminals between the supply line Vdd and the intermediate line nd0; its gate is also connected to the resetb input.

Figure 7:
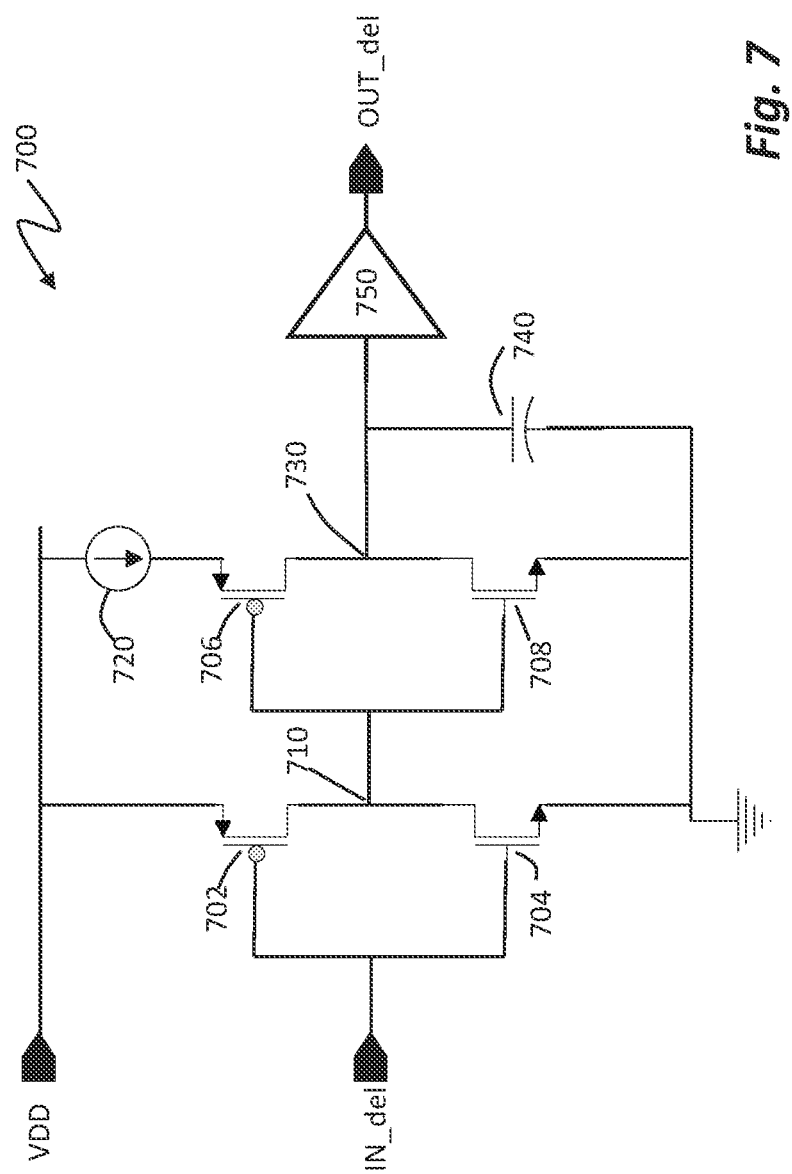
FIG. 7 illustrates a transistor-level circuit diagram of a delay generator as shown in FIGS. 3 and 4.

FIG. 7 illustrates a transistor-level circuit diagram of an example delay generator 700 according to one or more embodiments. The skilled person will appreciate he the delay generator may be implement in many different forms, and that the examples shown in FIGS. 7 and 8 are illustrative only.

The delay generator 700 comprises two pairs of FETS 702 and 704, 706 and 708 coupled between a supply rail VDD and a ground, each pair arranged as an inverter. The first pair of FETs 702 and 704 inverts an input IN_del, which is connected to the gates of each of the FETs 702 and 704, such that a node 710 between the transistors is low whenever the input is high. The node 710 is connected to the gates of each of the transistors in the secondary inverter from formed of FETS 706 and 708, and this inverter operates such that an output node 730 is an inverted copy of the node 710. In this circuit, the second inverter is not directly connected to the supply rail VDD, but includes a current source between the upper FET 706 and VDD. The output node is coupled to the ground through one or more parallel capacitors 740. The current source thus charges the capacitor or capacitors whenever the input IN_del is high. The output node 730 is connected to the output, OUT_del, of the delay generator, through a hysteretic buffer 750. The output OUT_del of the circuit 700 thus only goes high once the capacitor has charged to a level corresponding to a threshold set by the hysteretic buffer 750.

Figure 8:
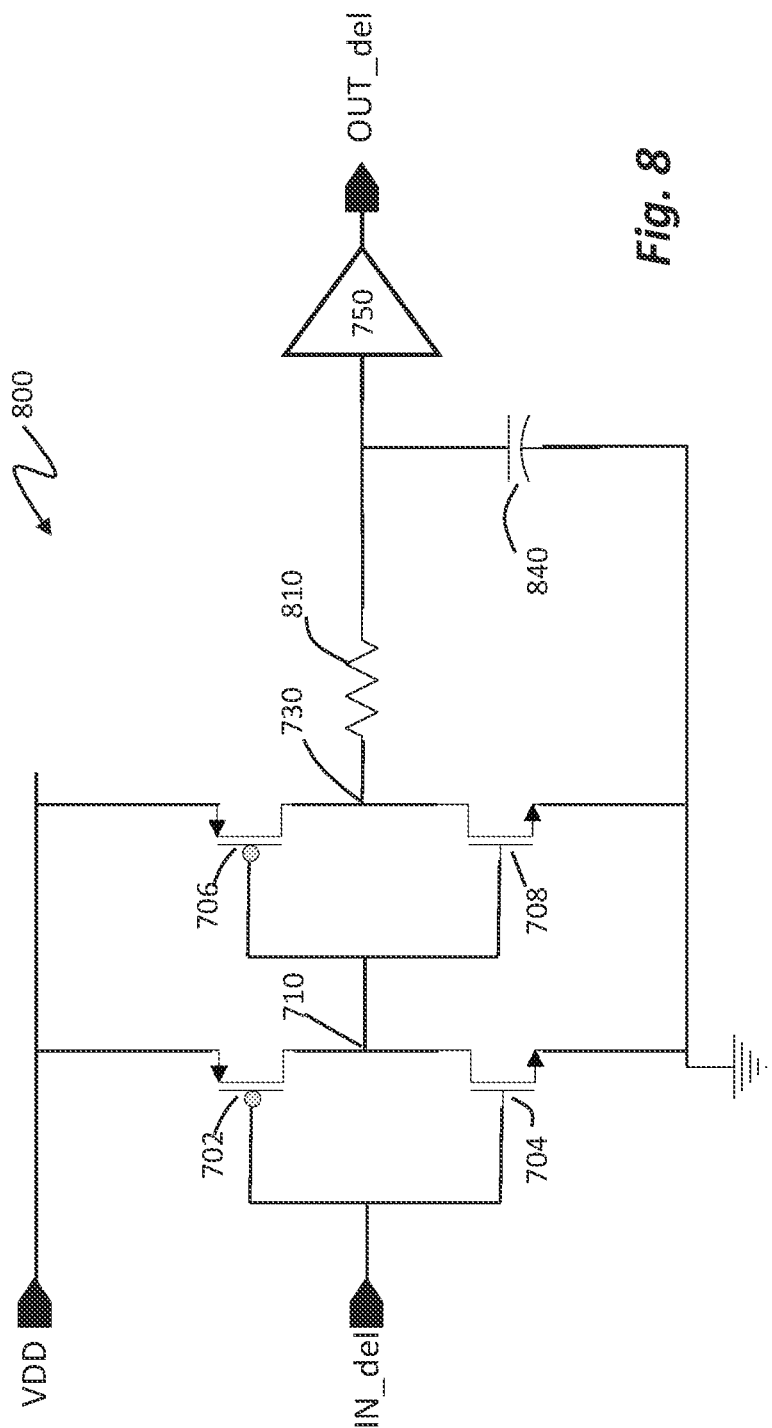
FIG. 8 illustrates an alternative, RC-based, transistor-level circuit diagram of the delay generator shown in FIGS. 3 and 4.

FIG. 8 illustrates a transistor-level circuit diagram of an example delay generator 800 according to one or more other embodiments. This delay generator 800 also comprises two pairs of FETS 702 and 704, 706 and 708 coupled between a supply rail VDD and a ground, each pair arranged as an inverter. The first pair of FETs 702 and 704 inverts an input IN_del, which is connected to the gates of each of the FETs 702 and 704, such that a node 710 between the transistors is low whenever the input is high. The node 710 is connected to the gates of each of the transistors in the secondary inverter from formed of FETS 706 and 708, and this inverter operates such that an output node 730 is an inverted copy of the node 710. In this circuit, the second inverter is directly connected to the supply rail VDD, but the output node is coupled to the ground through a series combination of a resistor 810 and one or more parallel capacitors 740. The resistor thus charges the capacitor or capacitors whenever the input IN_del is high, although in this circuit, the charging of the capacitor is not constant, but reduces linearly since as the voltage on the capacitor or capacitors rises, the voltage difference across the resistor falls and hence the charging current falls. The capacitor is connected to the output, OUT_del, of the delay generator, through a hysteretic buffer 750. The output OUT_del of the circuit 700 thus only goes high once the capacitor has charged to a level corresponding to a threshold set by the hysteretic buffer 750.

A non-limiting example application of a pulse stretcher as disclosed herein will now be considered. This application is in the field of battery management systems, in which it is necessary to monitor battery cells and control the charging and discharging. Thereto, each battery cell controller (BCC) communicates with a central processing unit (CPU) to give a constant battery health status, or to prevent any defective battery cells. The communication between BCC and CPU, or between two BCC units may be established by point-to-point differential communication using a galvanically isolated bus. Typically, the isolation is provided by magnetic coupling across transformers, and the units use bidirectional transceivers, to transmit attenuated messages both upstream and downstream through a daisy chain.

To conserve energy, a BCC unit may be placed into a sleep mode or low power mode, and a system wake-up may be triggered by either an event internal to the BCC, or by a pack controller (typically an MCU) or the CPU. In the event of an internal wake-up condition, the BCC device initiates dedicated wake-up pulse sequence on the bus both upstream and downstream in the data chain to alert pack controller. To ensure the message wake-up propagates on the entire chain to the pack controller, the neighbouring BCC in the daisy chain forwards the received wake up sequence to the next device in the chain.

In some protocols the operating frequency may be several megahertz; for example in the transformer physical layer (TPL) protocol developed by and with NXP Semiconductors, the bit frequency is typically 4 MHz resulting in pulse duration less than 125 ns—typically a few nanoseconds or a few tens of nanoseconds. When a wake-up message is sent to the bus, wake-up comparator in the next BCC receiver detects the short bus impulse and must send the information to the BCC control logic. However, since this BCC may be in the sleep or low-power mode, its high-power oscillator typically is not enabled, and in order to ensure that the signal can be captured by the low-power control logic, it must be stretched to accommodate the lower frequency of the low-power control logic—that is to say it must be stretched to a duration of several microseconds. The stretching may be performed by means of a pulse stretcher as disclosed herein.

By now it will be appreciated that there has, according to a first aspect, been disclosed a pulse stretcher comprising: a stretcher input (10) configured to receive an input pulse; a stretcher output (20); an asynchronous finite state machine, FSM (30) having a first FSM input connected to the input, and an FSM output connected to the stretcher output; and a delay generator (40) having a delay input connected to the stretcher output, and a delay output connected to a second input of the FSM. The asynchronous FSM comprises: a first Muller C-element gate (250) having an output connected to the stretcher output, a second Muller C-element gate (260) having an output. The asynchronous FSM further comprises a combinatorial logic circuit (270) connected to the stretcher input, to the delay output, to first and second first-gate inputs of the first C-element, and to first and second second-gate inputs of the second C-element. The first and second Muller C-element gates are cross-coupled via the combinatorial logic, such that the respective outputs of the C-element gates are complementary and, in response to receiving the input pulse at the stretcher input, the output of the first Muller C-element gate provides a stretched version of the input pulse.

In one or more embodiments, the delay generator is configured to, in response to receiving an input signal at the delay input, provide a signal at the delay output immediately following a predetermined delay period. In one or more embodiments the asynchronous FSM is configured to stretch the input pulse by a duration which is determined by the predetermined delay period. The delay generator may comprise a capacitor, and the predetermined delay period corresponds to a time to charge the capacitor to a threshold voltage. The delay generator may further comprise a resistor, and the capacitor is configured to be charged by a current through the resistor, in other embodiments, the delay generator further comprises a current source, and the capacitor is configured to be charged by the current source.

In one or more embodiments the combinatorial logic comprises an AND gate (472) and first (474), second (476) and third (478) NAND gates. The AND gate (472) and the first NAND gate (474) may each have a first input connected to the stretcher input, a respective second input connected to the output of the second (60) and first (50) Muller C-element gate respectively, and an respective output connected to a first input of the first and second Muller C-element gate respectively. The second (476) and third (478) NAND gates may each have a respective first input connected to the output of the delay generator and an inverted version of the output of the delay generator respectively, a respective second input connected to the output of the second and first Muller C-element gate respectively, and a respective output connected to a second input of the first and second Muller C-element gate respectively.

In one or more embodiments the combinatorial logic further comprises an inverter (482) configured to provide the inverted version of the output of the delay generator.

In one or more embodiments, the AND gate (472) and the first NAND gate (474) each has a first input connected to the stretcher input, a respective second input connected to the output of the second (60) and first (50) Muller C-element gate respectively, and an respective output connected to a first input of the first and second Muller C-element gate respectively; the second (476) and third (478) NAND gates each has a respective first input connected to the output of the delay generator and an inverted version of the output of the delay generator respectively, a respective second input connected to the output of the second and first Muller C-element gate respectively, and a respective output connected to a second input of the first and second Muller C-element gate respectively; and the combinatorial logic further comprises an inverter (482) configured to provide the inverted version of the output of the delay generator.

In one or more embodiments the stretcher output (20) comprises an output terminal (422) and a buffer (424) connected between the output terminal and the asynchronous FSM. At least one of first and second Muller C-element gate may have a respective connection (452, 462) configured to reset the gate.

According to a second aspect, there has been provided a pulse stretcher comprising: an input (10); an output (20); an asynchronous finite state machine; and a delay generator (40) having a delay input connected to the output, and a delay output connected to a second input of the FSM, and configured to provide a signal at the delay output at the end of a predetermined delay following receiving a signal at the delay input. The asynchronous FSM comprises a pair of cross-coupled Muller C-element gates comprising: a first Muller C-element gate (50) having a first-gate output connected to the output, a second Muller C-element gate (60), having a second-gate output.

In one or more embodiments, the pair of cross coupled Muller C-element gates are cross coupled by means of combinatorial logic. The combinatorial logic may comprise an AND gate (472) and first (474), second (476) and third (478) NAND gates.

In one or more embodiments, the AND gate (472) and the first NAND gate (474) each has a first input connected to the stretcher input, a respective second input connected to the output of the second (60) and first (50) Muller C-element gate respectively, and an respective output connected to a first input of the first and second Muller C-element gate respectively. In one or more embodiments, the second (476) and third (478) NAND gates each has a respective first input connected to the output of the delay generator and an inverted version of the output of the delay generator respectively, a respective second input connected to the output of the second and first Muller C-element gate respectively, and a respective output connected to a second input of the first and second Muller C-element gate respectively. The combinatorial logic may further comprise an inverter (482) configured to provide the inverted version of the output of the delay generator.

In one or more embodiments the AND gate (472) and the first NAND gate (474) each has a first input connected to the stretcher input, a respective second input connected to the output of the second (60) and first (50) Muller C-element gate respectively, and an respective output connected to a first input of the first and second Muller C-element gate respectively; the second (476) and third (478) NAND gates each has a respective first input connected to the output of the delay generator and an inverted version of the output of the delay generator respectively, a respective second input connected to the output of the second and first Muller C-element gate respectively, and a respective output connected to a second input of the first and second Muller C-element gate respectively; and the combinatorial logic further comprises an inverter (482) configured to provide the inverted version of the output of the delay generator.

The stretcher output (20) may comprise an output terminal (422) and a buffer (424) connected between the output terminal and the asynchronous FSM. At least one of the first and second Muller C-element gate may have a respective connection (452, 462) configured to reset the gate.

From reading the present disclosure, other variations and modifications will be apparent to the skilled person. Such variations and modifications may involve equivalent and other features which are already known in the art of delay circuits, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims [delete if not relevant] and reference signs in the claims shall not be construed as limiting the scope of the claims. Furthermore, the word "may" is used in a permissive sense (i.e., what you meaning having the potential to), rather than the mandatory sense (i.e., meaning must). Similarly, the words "include," "including," and "includes" mean including, but not limited to.

LIST OF REFERENCE NUMERALS USED

10 stretcher input
20 stretcher output
30 finite state machine
40 delay generator 110 incoming pulse
112 incoming pulse duration t
120 stretched version
122 stretched version duration T
124 delay d
200 pulse stretcher
250 First Muller C-element gate
260 Second Muller C-element gate
270 combinatorial logic circuit
200 pulse stretcher
322 output terminal
324 buffer
422 output terminal
424 output buffer
452 C-element gate reset input
462 C-element gate reset input
472 AND gate
474 first NAND gate
476 second NAND gate
478 third NAND gate
482 inverter
501 first time-slot: reset
502 second time-slot: ready
503 third time-slot: start of input pulse and propagation delay
504 fourth time-slot: conclusion of input pulse
505 fifth time-slot: conclusion of delay
506 sixth time-slot: reset
507 seventh time-slot: ready
510 stretcher input "IN",
552 signal resetb
554 first input IN1_S1 to first C-element gate,
556 second input IN2_S1 to first C-element gate,
558 output S1 from first C-element gate
564 first input IN1_S0 to second C-element gate,
566 second input IN2_S0 to second C-element gate,
568 output S0 "OUT" from second C-element gate
570 output OUT_del from delay generator
602,604,606,608 P-FET bridge transistors
610 P-FET output transistor
612 P-FET across bridge-node
622,624,626,628 N-FET bridge transistors
630 N-FET output transistor
632 N-FET across bridge-node
642, 644, 646 N-FET resetb transistor
702, 704 First Inverter FETs
706, 708 Second inverter FETS
710 Node
720 Current source
730 Output Node
740 Capacitor
750 Hysteretic buffer
810 Resistor

The invention claimed is:

1. A pulse stretcher comprising:
a stretcher input configured to receive an input pulse;
a stretcher output;
an asynchronous finite state machine, FSM having a first FSM input connected to the input, and an FSM output connected to the stretcher output; and
a delay generator having a delay input connected to the stretcher output, and a delay output connected to a second input of the FSM;
wherein the asynchronous FSM comprises:
a first Muller C-element gate having an output connected to the stretcher output,
a second Muller C-element gate having an output; and
a combinatorial logic circuit connected to the stretcher input, to the delay output, to first and second first-gate inputs of the first C-element, and to first and second second-gate inputs of the second C-element;
wherein the first and second Muller C-element gates are cross-coupled via the combinatorial logic, such that the respective outputs of the C-element gates are complementary and, in response to receiving the input pulse at the stretcher input, the output of the first Muller C-element gate provides a stretched version of the input pulse.

2. The pulse stretcher of claim 1, wherein the combinatorial logic comprises an AND gate and first, second and third NAND gates.

3. The pulse stretcher of claim 2, wherein the AND gate and the first NAND gate each has a first input connected to the stretcher input, a respective second input connected to the output of the second and first Muller C-element gate respectively, and an respective output connected to a first input of the first and second Muller C-element gate respectively.

4. The pulse stretcher of claim 3, wherein the second and third NAND gates each has a respective first input connected to the output of the delay generator and an inverted version of the output of the delay generator respectively, a respective second input connected to the output of the second and first Muller C-element gate respectively, and a respective output connected to a second input of the first and second Muller C-element gate respectively.

5. The pulse stretcher of claim 3, wherein the combinatorial logic further comprises an inverter configured to provide the inverted version of the output of the delay generator.

6. The pulse stretcher of claim 3, wherein the stretcher output comprises an output terminal and a buffer connected between the output terminal and the asynchronous FSM.

7. The pulse stretcher of claim 3, wherein the first and second Muller C-element gate each has a respective connection configured to reset the gate.

8. The pulse stretcher of claim 2, wherein the second and third NAND gates each has a respective first input connected to the output of the delay generator and an inverted version of the output of the delay generator respectively, a respective second input connected to the output of the second and first Muller C-element gate respectively, and a respective output connected to a second input of the first and second Muller C-element gate respectively.

9. The pulse stretcher of claim 2, wherein the combinatorial logic further comprises an inverter configured to provide the inverted version of the output of the delay generator.

10. The pulse stretcher of claim 2, wherein the stretcher output comprises an output terminal and a buffer connected between the output terminal and the asynchronous FSM.

11. The pulse stretcher of claim 2, wherein the first and second Muller C-element gate each has a respective connection configured to reset the gate.

12. The pulse stretcher of claim 2, wherein the delay generator is configured to, in response to receiving an input signal at the delay input, provide a signal at the delay output immediately following a predetermined delay period.

13. The pulse stretcher of claim 1, wherein the combinatorial logic further comprises an inverter configured to provide the inverted version of the output of the delay generator.

14. The pulse stretcher of claim 1, wherein the stretcher output comprises an output terminal and a buffer connected between the output terminal and the asynchronous FSM.

15. The pulse stretcher of claim 1, wherein the first and second Muller C-element gate each has a respective connection configured to reset the gate.

16. The pulse stretcher of claim 1, wherein the delay generator is configured to, in response to receiving an input signal at the delay input, provide a signal at the delay output immediately following a predetermined delay period.

17. The pulse stretcher of claim 16, wherein the asynchronous FSM is configured to stretch the input pulse by a duration which is determined by the predetermined delay period.

18. The pulse stretcher of claim 17, wherein the delay generator comprises a capacitor, and the predetermined delay period corresponds to a time to charge the capacitor to a threshold voltage.

19. The pulse stretched of claim 18, wherein the delay generator further comprises a resistor, and the capacitor is configured to be charged by a current through the resistor.

20. The pulse stretched of claim 18, wherein the delay generator further comprises a current source, and the capacitor is configured to be charged by the current source.

* * * * *